United States Patent
Jas et al.

(10) Patent No.: US 7,155,648 B2
(45) Date of Patent: Dec. 26, 2006

(54) LINEAR FEEDBACK SHIFT REGISTER RESEEDING

(75) Inventors: Abhijit Jas, Austin, TX (US); Srinivas Patil, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 476 days.

(21) Appl. No.: 10/666,169

(22) Filed: Sep. 19, 2003

(65) Prior Publication Data
US 2005/0066244 A1   Mar. 24, 2005

(51) Int. Cl.
*G01R 31/3177* (2006.01)
*G01R 31/3187* (2006.01)

(52) U.S. Cl. .................. 714/726; 714/732; 714/733

(58) Field of Classification Search ......... 714/726–733
See application file for complete search history.

(56) References Cited

U.S. PATENT DOCUMENTS

| | | | | |
|---|---|---|---|---|
| 6,032,278 | A | 2/2000 | Parvathala et al. | 714/726 |
| 6,477,674 | B1 | 11/2002 | Bates et al. | 714/738 |
| 6,510,398 | B1 | 1/2003 | Kundu et al. | 702/117 |
| 6,564,347 | B1 | 5/2003 | Mates | 714/727 |
| 6,950,974 | B1 * | 9/2005 | Wohl et al. | 714/733 |
| 6,993,694 | B1 * | 1/2006 | Kapur et al. | 714/733 |
| 2002/0124217 | A1 * | 9/2002 | Hiraide et al. | 714/726 |
| 2003/0145286 | A1 * | 7/2003 | Pajak et al. | 716/1 |

OTHER PUBLICATIONS

"Linear Feedback Shift Registers", www.math.cudenver.edu/~wcherowi/courses/m5410/m5410fsr.html, 1-8.

"What's an LFSR?", *Texas Instruments SCTA036A*, (Dec. 1, 1996), 11 pgs.

Al-Yamani, Ahmad A., et al., "Built-In Reseeding For Serial Bist", *Proceedings 21st IEEE VLSI Test Symposium*, (2002), 1-22.

Bayraktaroglu, Ismet, et al., "Test volume and application time reduction through scan chain concealment", *Proceedings of the 38th Design Automation Conference*, (2001), 151-5.

Hellebrand, Sybille, "A Mixed Mode Bist Scheme Based on Reseeding of Folding Counters", *Proceedings International Test Conference 2000*, 778-84.

Jas, Abhijit, et al., "An Embedded Core DFT Scheme to Obtain Highly Compressed Test Sets", *Test Symposium, 1999. (ATS '99) Proceedings. Eighth Asian*, Nov. 16-18, 1999, 275-280.

(Continued)

*Primary Examiner*—R. Stephen Dildine
(74) *Attorney, Agent, or Firm*—Schwegman, Lundberg, Woessner & Kluth, P.A.

(57) ABSTRACT

An apparatus has an integrated circuit that includes a seed register, a linear feedback shift register to load a test vector into a number of scan chains, and a signature register to receive a test response from the scan chains. The seed register, the linear feedback shift register, and the signature register each have the same register length. The linear feedback shift register and the signature register have the same shift frequency that is greater than a frequency at which a seed vector is loaded into the seed register. The linear feedback shift register is adapted to be selectively provided with bits to control a degree to which its vector is dependent on previous vectors. The scan chains may be configured as a single group providing a test response to a single input signature register or a set of groups providing a test response to a multiple input signature register.

30 Claims, 6 Drawing Sheets

OTHER PUBLICATIONS

Jas, Abhijit, et al., "Scan vector compression/decompression using statistical coding", *VLSI Test Symposium, 1999. Proceedings. 17th IEEE*, Apr. 25-29, 1999, 114-120.

Jas, Abhijit, et al., "Test vector decompression via cyclical scan chains and its application to testing core-based designs", *Test Conference, 1998. Proceedings. International*, Oct. 18-23, 1998, 458-464.

Jas, Abhijit, "Virtual scan chains: a means for reducing scan length in cores", *VLSI Test Symposium, 2000. Proceedings. 18th IEEE*, Apr. 30-May 4, 2000, 73-78.

Liang, Hua-Guo, et al., "Two-Dimensional Test Data Compression for Scan-Based Deterministic Bist", *Proceedings International Test Conference 2001*, 894-902.

Touba, Nur A., et al., "Transformed Pseudo-Random Patterns for BIST", *Proceedings 13th IEEE VLSI Test Symposium*, (1995),410-16.

Treytnar, Dieter, et al., "LFSR Test Pattern Crosstalk in Nanometer Technologies", *IEEE Workshop on Signal Propagation on Interconnects, Pisa, Italy*, (May 12-15, 2002), 115-118.

Jas, Abhijit, "Dissertation: Test Vector Compression Techniques for Systems-on-Chip", *University of Texas at Austin*, 117 pages, (May 2001).

\* cited by examiner

LINEAR FEEDBACK SHIFT REGISTER RESEEDING

TECHNICAL FIELD

Embodiments of the invention relate generally to scan testing in integrated circuits.

BACKGROUND

Integrated circuits are becoming more densely packed with increasing numbers of individual circuit elements. Typically, testing these circuit elements is performed by generating a test pattern and applying the test pattern to the integrated circuit using scan chains, where each scan chain includes a number of individual scan cells. Depending on the test pattern, the responses of the integrated circuit to the test pattern can provide an accurate indication of the existence or non-existence of defects or faults.

The test pattern is applied as a test vector, where the test vector is a set of bits applied to a number of scan cells in a scan chain. With a test vector loaded into the scan chain, the device being tested is stimulated. The response to the stimulus is compared to a reference vector stored in a tester. Pass/fail functionality of the device under test may be determined by this comparison.

Design for testability (DFT) features that provide for embedded testing of certain integrated circuit functions aid in the testing of the integrated circuit. Another DFT feature that can be implemented is a built-in self-test (BIST) capability. However, as the complexity of integrated circuits, such as microprocessors and application-specific integrated circuits, ASICs, increases, testing requirements also increase including the number and size of test vectors to appropriately test the integrated circuit. These enhancements in the test requirements increase both the needed testing buffer capacity and the test application time.

DETAILED DESCRIPTION

Figure 1:
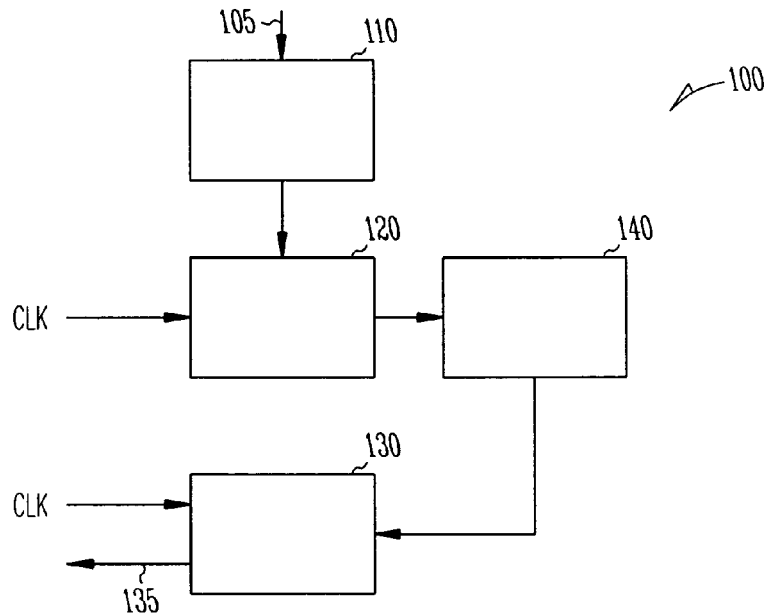
FIG. 1 depicts a block diagram of an embodiment of an apparatus having a linear feedback shift register for testing, according to the present invention.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

The internal circuitry of a microprocessor is often separated into combinational blocks and sequential blocks, the sequential blocks comprising clocked circuitry such as flip-flops. A circuit used for testing combinational and sequential circuit blocks in a microprocessor is a scan chain. A scan chain includes a plurality of storage elements that are cascaded such that the output of a first storage element is coupled to the input of the next stage storage element. Scan chains thus allow testing of microprocessor circuit blocks by serially scanning in test patterns to the storage elements. The test patterns are then applied to the circuit blocks, and circuit test results are serially scanned out.

In an embodiment, a set of test patterns, or test vectors, are applied to a number of scan chains such that the test vectors are compressed test vectors that are decompressed on the die of the integrated circuit. A compression scheme uses reseeding of a linear feedback shift register (LFSR) to compress/decompress test data. A LFSR is a shift register that uses a clock signal to advance a bit through the bit cells of the LFSR, typically, from one bit cell to the next most-significant bit cell. Linear feedback can be provided by using an exclusive-or configuration in a feedback loop of the bit cells. When the bit cells are loaded with a seed vector (an initial vector), clocking the LFSR will generate a pseudorandom pattern of 1s and 0s. Subsequent loading of the LFSR with a new seed vector defines a reseeding of the LFSR.

With the LFSR loaded with a seed vector, the LFSR loads initial scan cells in a number of scan chains, where bits from the LFSR are clocked into an initial scan cell of the scan chains. The seed vector in the LFSR provides a starting reference for the LFSR to generate a set of test vectors for testing at least a portion of the integrated circuit. The linear expansion of bits from the LFSR into the scan chains provides an algebraic representation for solving a linear system of equations.

In an embodiment, reseeding a LFSR is used to compress test cubes. Test cubes are automatic test pattern generation (ATPG) created vectors in which unspecified inputs of a vector are left as "don't cares." A variable, i.e., a single input of a vector, is a "don't care" if its value is not relevant for the space of test vectors applied, such as a variable that would result in an already determined output. In an embodiment, the LFSR uses bits from a test controller to perform a series of test based on the seed vector. Reseeding the LFSR allows testing for another test cube.

An embodiment for an architecture of a compression scheme provides for the usage of slower testers in conjunction with a higher internal scan speed within the integrated circuit and for the usage of testers with less memory, prolonging the useful life of existing testers. In an embodiment, an architecture for an LFSR is configured with an accumulation feature to enable compression for a larger test cube space than what is possible using a traditional LFSR reseeding scheme.

Test data compression can be realized by reseeding LFSRs with an initial state to steer it towards a particular vector space. This can boost coverage during a logic BIST operation. In a deterministic test environment where ATPG patterns are derived, LFSR reseeding can generate fully specified vectors from a vector which has only a few bits specified. Since the fully specified vector has more bits than the seed needed to generate it, the LFSR acts as an expander, which expands the seed to the final vector, thus providing compression. As is known by those skilled in the art, if the LFSR length is (Smax+20), where Smax is the maximum number of specified bits in an ATPG pattern, then the probability of finding a seed to generate a required vector is close to 0.999999. Further savings in LFSR length can be obtained by using a reconfigurable LFSR, which is a LFSR whose characteristic polynomial can be changed on the fly based on some additional control inputs.

The test response collected from a set of scan chains used to stimulate the integrated circuit from the test vector generated by the LFSR is provided to a signature register, where a signature relates to a final result of the compression of a number of test patterns. The signature register collects one or more bits indicative of the test result. In a single input signature register (SISR), the incoming bits to the SISR for providing a signature to represent a test response are collected with each bit input on a clock cycle. In a multiple input signature register (MISR) multiple input bits are collected in a single clock cycle. The contents of the signature are compared with a reference to determine if the test has passed or failed.

FIG. 1 depicts a block diagram of an embodiment of an apparatus 100 having a linear feedback shift register 120. Apparatus 100 has one or more integrated circuits having LFSR 120, a seed register 110, and a signature register 130 for testing. A seed test vector is provided to seed register 110 via input 105. The seed test vector is loaded from seed register 110 to LFSR 120 such that LFSR 120 generates test vectors, or bit patterns, to a testing unit 140 for testing at least a portion of the integrated circuit in which LFSR 120, seed register 110, signature 130, and testing unit 140 are configured. The loading for seed register 110 to LFSR 120 can be preformed as a parallel load.

Signature register 130 receives a response from testing unit 140 to provide a compressed response at an output 135 at a conclusion of a test of the integrated circuit. A conclusion of a test may include a response of testing unit 140 to a stimuli associated with one test vector. In an embodiment, signature register 130 is a single input signature register (SISR). Alternately, signature register 130 may be configured as a multiple input signature register (MISR).

In an embodiment, the register lengths for each of the seed register 110, LFSR 120, and signature register 130 are equal. The shifting frequencies for the LFSR 120 and the signature register 130 are equal and are greater than the frequency at which a seed vector is loaded into seed register 110. The shifting frequencies for LFSR 120 and signature register 130 are provided by clock inputs.

In an embodiment, input 105 may be provided from within the same integrated circuit in which seed register 110 is configured. Similarly, output 135 can be provided to a device within the same integrated circuit in which seed register 110 is structured. Alternately, input 105 may be provided from exterior to the integrated circuit in which seed register 110 is configured. In an embodiment, output 135 may be provided to a device exterior to the integrated circuit in which seed register is constructed. Input 105 and output 135 may be directed to a common control device.

Figure 2:
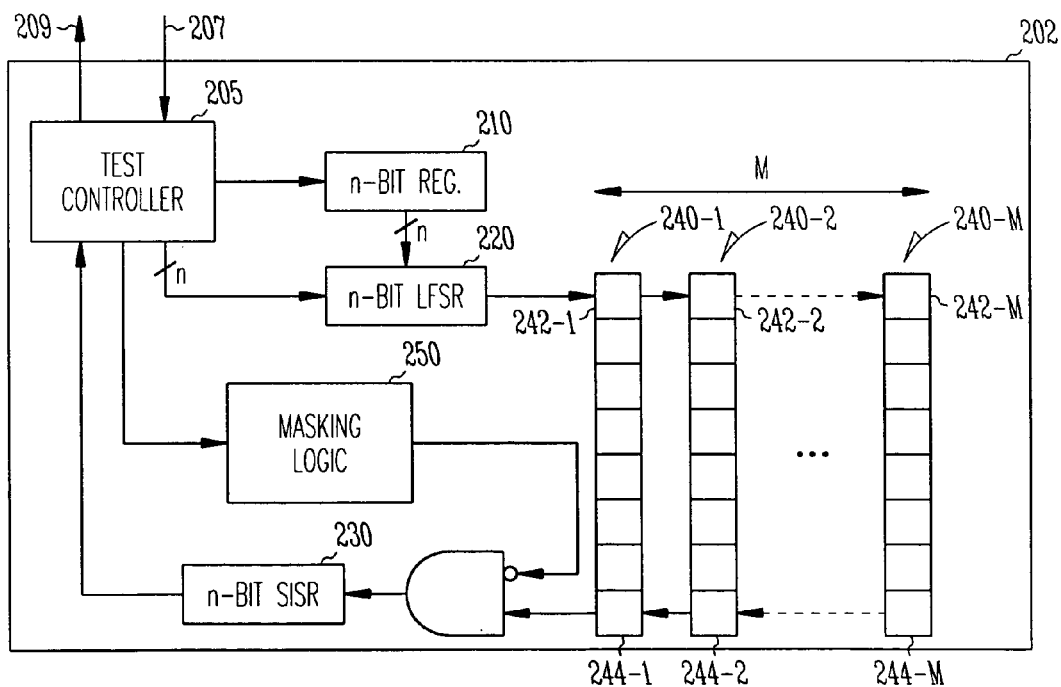
FIG. 2 depicts a block diagram of an embodiment of an apparatus including an integrated circuit having a seed register, a linear feedback shift register, and a signature register, according to the present invention.

FIG. 2 depicts a block diagram of an embodiment of an apparatus 200 including an integrated circuit 202 having a seed register 210, a linear feedback shift register 220, and a signature register 230. A seed test vector is provided to seed register 210 from a test controller 205. The seed test vector is loaded from seed register 210 to LFSR 220, which may be performed as a parallel load. LFSR 220 generates test vectors to a number of scan chains 240-1, 240-2, ... 240-M for testing at least a portion of integrated circuit 202. Signature register 230 receives a response from the scan chains 240-1, 240-2, ... 240-M to provide a compressed response that is sent to test controller 205. In an embodiment, signature register 230 is a SISR. Alternately, signature register 230 may be configured as a MISR.

In an embodiment, the register lengths for each of the seed register 210, LFSR 220, and signature register 230 are equal. The shifting frequencies for the LFSR 220 and the signature register 230 are equal and are greater than the frequency at which a seed vector is loaded into seed register 210. Clock inputs to LFSR 220 and signature register 230 for bit shifting are not shown in FIG. 2.

An tester external to integrated circuit 202, or chip 202, provides test vectors to test controller 205 via input 207, and test controller 205 provides test responses externally via output 209. Alternately, information is provided to test controller 205 with which test controller 205 determines a seed vector to be provided to seed register 210. Additionally, test controller 205 may provide information externally from integrated circuit 202 in different formats depending on the application and the device to which the information is transmitted.

Test controller 205 provides the seed vectors to seed register 210, test bits to LFSR 220, and receives a compressed response from signature register 230. Test controller 205 also manages the test clocks and provides the control signals for the test logic of integrated circuit 202. Under the control of test controller 205 testing is conducted using the scan chains 240-1, 240-2, ... 240-M.

Each scan chain 240-1, 240-2, ... 240-M has an initial scan cell 242-1, 242-2, ... 240-M, and a final scan cell 244-1, 244-2, ... 244-M, respectively. Initial scan cells 242-1, 242-2, ... 240-M are populated through LFSR 220. The test response is compacted into signature register 230 from the final scan cells 244-1, 244-2, ... 244-M. In an embodiment, with LFSR 220 having a register length of n bits, an internal shift frequency for the M scan chains is greater than M/n times a frequency at which the test vector is loaded into seed register 210.

The architecture of an embodiment as shown in FIG. 2 also allows a flexible X-masking scheme where the granularity of X-masking can be traded-off with hardware. Masking logic 250 provides a bit-slice level granularity that can be obtained using an extra bit to indicate if the bit-stream flowing into SISR 230 needs to be masked. A slice is the values of all scan cells at a particular bit position in a scan chain. Response bits that signify unknown logic are masked out using masking logic 250. Test data and test time reduction can be achieved in this embodiment. Alternative schemes such as segment masking can also be applied at the cost of a few extra control bits and some additional hardware, which may also result in saving test time.

An example of an embodiment is provided by considering a tester having 36 channels that correspond to 36 internal scan chains in an integrated circuit configured with each scan chain having a length of 1000 bits, i.e., having 1000 scan cells. With each scan chain having the same length, the scan chains are said to be balanced. The total test data, including stimulus and output response, for a test case with 500 compressed patterns in an ATPG process is 36 million bits, if the internal shift frequency of the scan chains is equal to the frequency that the tester loads the test data. In an embodiment, the internal scan shift frequency of a chip, or integrated circuit, such as chip 202 of FIG. 2, is 10 times that of the tester, and chip 202 is configured with 360 internal scan chains, each of which is 100 bits long. In an embodiment in which 10% of the bits are specified in each bit slice, an LFSR having a register length of 56 bits (Smax+20=36+20) can be used. Thus the effective length of each bit-slice becomes 56 and the effective test vector length is the effective length times the number of bit-slices, which is 56*100=5600, instead of 36000 as in the above case in which the internal shift frequency of the scan chains is that of the frequency of the tester. However, reducing the specified bits in each bit slice to not more than 36 specified bits in each bit slice places additional constraint on the ATPG tool that may increase the pattern count slightly. In an embodiment, this reduction of specified bits leads to about a 10% increase in pattern count. In such an embodiment, the total number of ATPG patterns increases from the original 500, as in the above case, to 550. The total test data volume becomes (2*550*5600) bits=6.16 million bits. This scheme using only the specified bits along with the 10× internal shift frequency provides almost a six times reduction in pattern count and test time. In an embodiment, reconfigurable LFSRs, as are known to those skilled in the art, can be used to further reduce the test vector length. In another embodiment, scan chains that are not balanced, that is, the scan chains have varying bit lengths, can be used.

Figure 3:
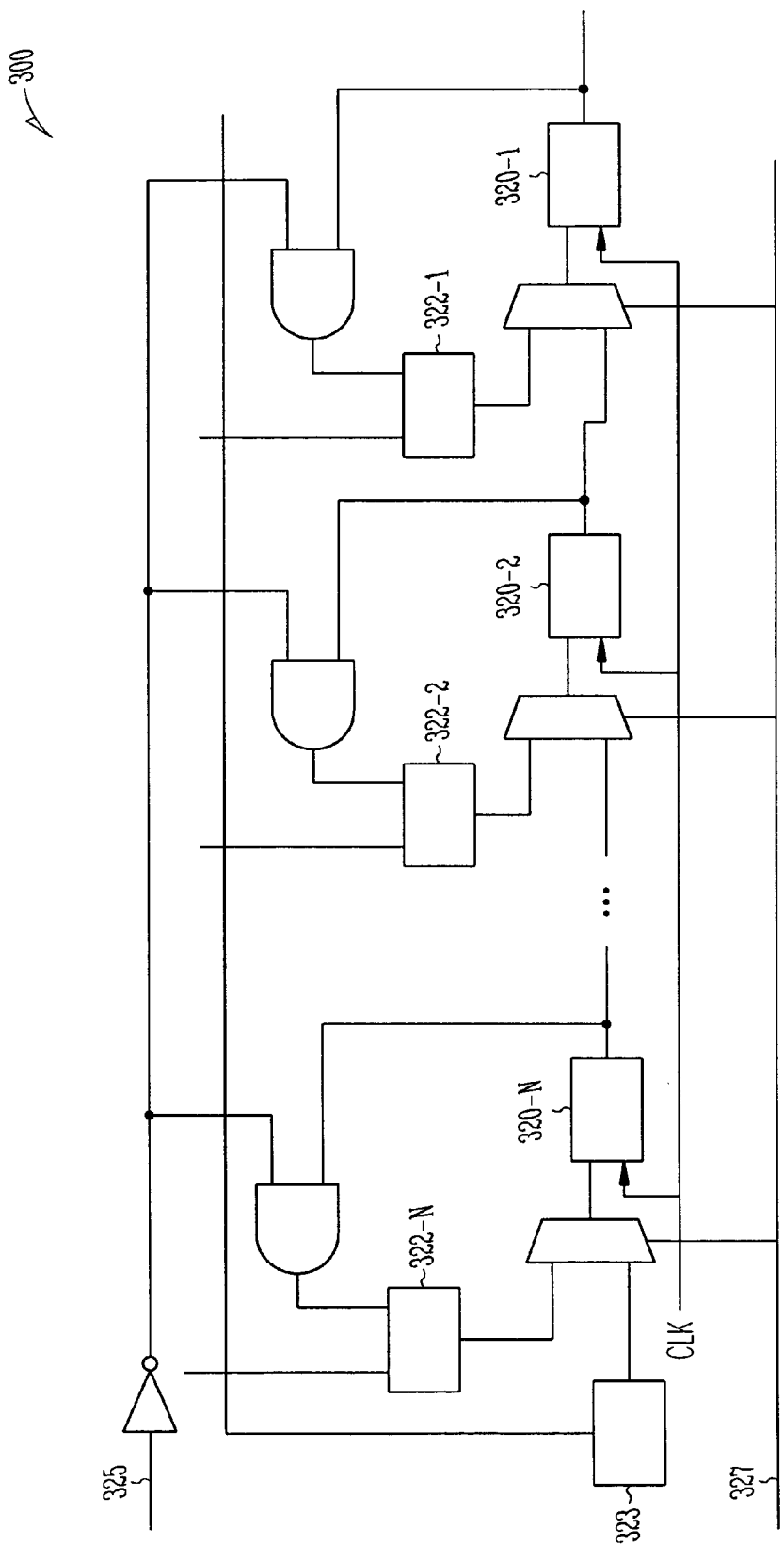
FIG. 3 depicts a block diagram of an embodiment of elements of a linear feedback shift register, according to the present invention.

FIG. 3 depicts a block diagram of an embodiment of elements of a linear feedback shift register 300. LFSR 300 has a register length corresponding to N bits using bit cells 320-1, 320-2, . . . 320-N. The input to each bit cell 320-1, 320-2 . . . 320-N is controlled by exclusive-or logic units 322-1, 322-2 . . . 322-N, respectively. Exclusive-or logic unit 323 provides the feedback from bit cell 322-1 to bit cell 322-N for LFSR 300. In an embodiment, exclusive-or logic units are realized using exclusive-or gates. This configuration or architecture for LFSR 300 allows incoming bits during a parallel load to be computed with the current state of LFSR 300 using exclusive-or logic. LFSR 300 allows free variables to be accumulated during the reseeding process to enhance the use of free-variables. The bits being shifted into the scan chain from LFSR 300 are a function of not just the most recent seed loaded from a seed register but past seeds as well. This architecture provides additional flexibility in finding a seed to generate specified bits, reducing further the likelihood of not being able to find a seed vector. Due to the variation in the distribution of the specified bits in test cubes, the number of free variables to be implemented varies. The accumulative feature of this embodiment of an architecture for LFSR 300 allows variables from earlier seeds to be reused for solving more complex equations.

In addition to the bit control to LFSR 300 provided by exclusive-or logic 322-1, 322-2, . . . 322-N, loading of bit cells 320-1, 320-2, . . . 320-N is also controlled by a load input 327. In an embodiment, a load signal is provided to load input 327 from a test controller such as test controller 205 of FIG. 2.

In an embodiment, the test vector in the bit cells 320-1, 320-2, . . . 320-N of LFSR 300 are also regulated by a flush control input 325. A signal provided to flush control input 325 allows old variables in LFSR to be removed or flushed, thus changing the LFSR state to a state independent of past variables. Flush control input 325 provides control of the degree to which the current LFSR state is dependent on past history, thus allowing control of the degree of difficulty in solving linear equations.

Figure 4:
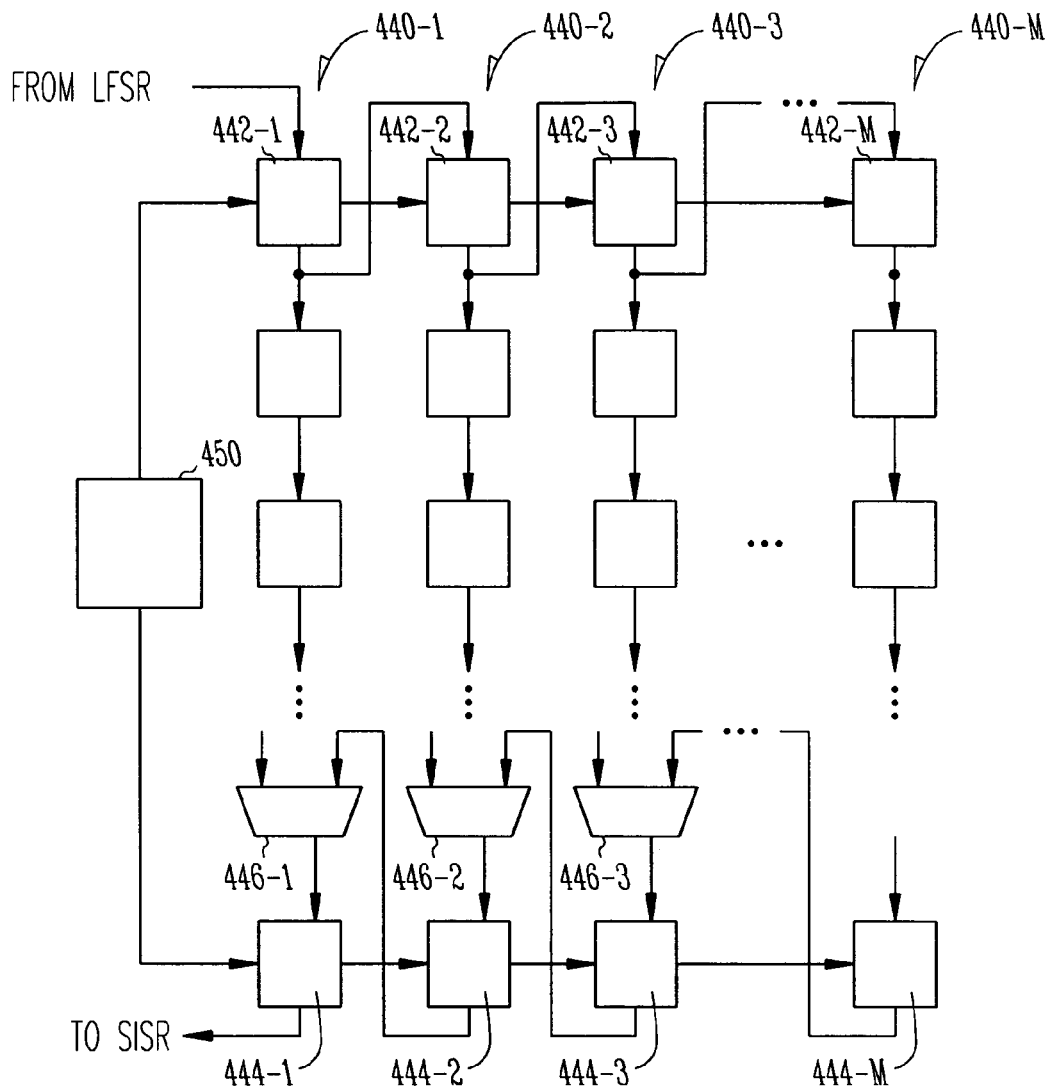
FIG. 4 depicts a block diagram of an embodiment of a number of scan chains that are used in conjunction with a linear feedback shift register and a signature register, according to the present invention.

FIG. 4 depicts a block diagram of an embodiment of a number of scan chains 440-1, 440-2, 440-3, . . . 440-M that are used in conjunction with a linear feedback shift register and a signature register in an integrated circuit, such as LFSR 220 and SISR 230 of FIG. 2. Each scan chain 440-1, 440-2, 440-3, . . . 440-M has an initial scan cell 442-1, 442-2, 442-3, . . . 442-M and a final scan cell 444-1, 444-2, 444-3, . . . 444-M, respectively. In an embodiment of an architecture having scan chains configured as in FIG. 4, each initial scan cells, or top most scan cells, 442-1, 442-2, 442-3, . . . 442-M is populated using an LFSR, and a test response is compacted into the signature register, such as an SISR, from the final scan cells, or bottom-most cells, 444-1, 444-2, 444-3, . . . 444-M. This can be viewed as a horizontal mode of operation, where bits are shifted into each scan chain at the same relative bit position within the scan chain. In a vertical mode of operation, bits are shifted down a scan chain from one level to a lower or next level.

In the embodiment shown in FIG. 4, initial scan cell 442-1 of scan chain 440-1 is loaded from an LFSR. Initial scan chain 442-2 of scan chain 440-2 is loaded from the output of initial scan cell 442-1. Initial scan chain 442-3 of scan chain 440-3 is loaded from the output of initial scan cell 442-2. Initial scan chain 442-M of scan chain 440-M is loaded from the output of initial scan cell 442-(M−1). The initial scan cell of a first chain of the number of scan chains receives an input from a LFSR, and the initial scan cell in the remaining scan chains receives an input from the output an initial scan cell of another scan chain. The loading along this initial level of scan chains 440-1 . . . 440-M is performed in conjunction with clocking the bits from the LFSR.

A response is provided to a single input signature register from the output of final scan cell 444-1 of scan chain 440-1. Final scan cell 444-1 has an input from a multiplex unit 446-1 that receives an input from the previous scan cell in scan chain 440-1 and an input from the output of final scan cell 444-2 of scan chain 440-2. Final scan cell 444-2 provides an output to final scan chain 440-1 and has an input from a multiplex unit 446-2 that receives an input from the previous scan cell in scan chain 440-2 and an input from the output of final scan cell 444-3 of scan chain 440-3. Final scan cell 444-3 provides an output to final scan chain 440-2 and has an input from a multiplex unit 446-3 that receives an input from the previous scan cell in scan chain 440-3 and an input from the output of final scan cell 444-4 of scan chain 440-4. The structure is repeated until the last scan chain scan cell 444-M is reached. Final scan cell 444-M provides an output to scan chain 440-(M−1) and has an input from the previous scan cell in scan chain 440-M. An input to each final scan cell of each scan chain other than the final scan cell of the last scan chain in provided from multiplexing an output of the final scan cell of another scan chain, and an output of the final scan cell of the first scan chain is provided to a signature register. Movement of bits along the level of the final scan cells of scan chains 440-1 . . . 440-M is also performed in conjunction with the clocking of the LFSR. In an embodiment, the response from a final scan cell may be provided to a MISR.

In an embodiment as shown in FIG. 4, to allow shifting in vertical and horizontal modes, the initial scan cells at the top and the final scan cells at the bottom of the scan chains have two independent ways of controlling the shift direction. When horizontal mode shifting is taking place, the scan cells internal to the scan chains, that is, scan cells that are neither initial (top-most) nor final (bottom-most) scan cells do not shift. A shift controller 450 is used to regulate the shift mode as either horizontal or vertical. In an embodiment, horizontal and vertical shift control can be implemented using multiple shift clocks, one to shift in horizontal mode and one to shift in a vertical mode. In an embodiment, horizontal and vertical shift control can be implemented using clock gating.

Figure 5:
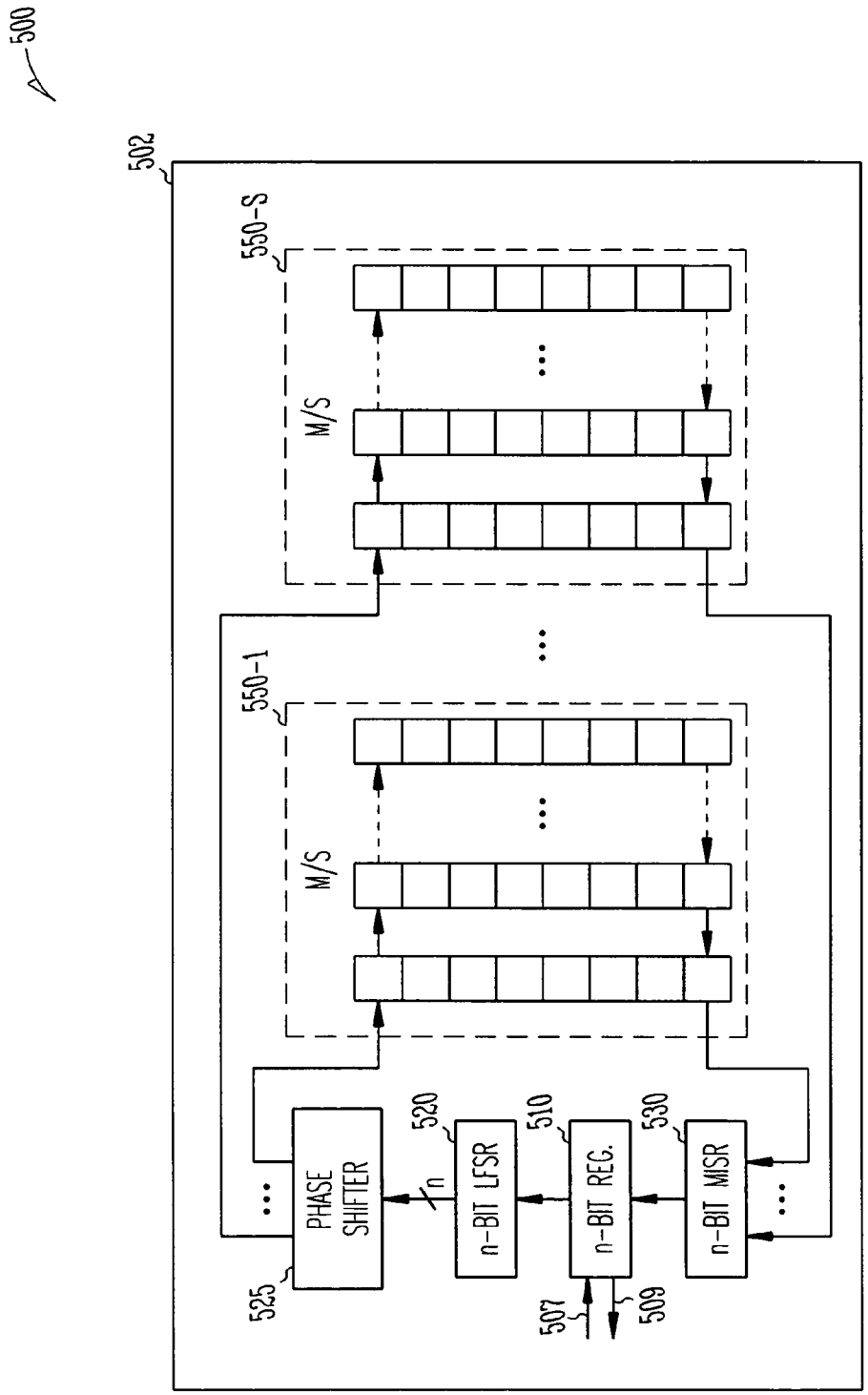
FIG. 5 depicts a block diagram of an embodiment of an apparatus including an integrated circuit having a seed register, a linear feedback shift register, a signature register, and a number of scan channels partitioned into groups, according to the present invention.

FIG. 5 depicts a block diagram of an embodiment of an apparatus 500 including an integrated circuit 502 having a seed register 510, a linear feedback shift register 520, a signature register 530, and a number of scan channels, M, partitioned into S groups 550-1-550-S. In various embodiments, multiple scan channels are available from the tester to integrated circuit 502 and all the scan channels can be utilized to load seed register 510. In an embodiment, an external tester has multiple connections to integrated circuit 502 to load seed register 510 via scan channels 507. In an embodiment, scan channels 507 of integrated circuit 502 are configured between signature register 510 and one or more test controllers, such as test controller 205 of FIG. 2, on integrated circuit 502. An architecture having multiple scan channels provides for the reduction of the time required to load the seed register by a factor, S, where S is the number of scan channels available for scan-in. To prevent a delay in loading from a tester, LFSR is configured to shift out an expanded seed S times faster than if a single scan channel were implemented. In an embodiment in which an internal scan shift frequency is limited to a specified maximum that is not S times faster than if a single scan channel were implemented, the scan chains are partitioned into S groups, where each group has M/S scan chains. In an embodiment, each of the S groups can be loaded simultaneously from LFSR 520 using different internal tap points of LFSR 520. In an embodiment, an optional phase shifter network 525 is used to provide bits to each of the group of scan chains from the different internal tap points of LFSR 520. This partitioning allows the relative rate of internal scan shift frequency and the tester frequency to be the same (M/(S×n)). In an embodiment where the total number of scan chains is M and LFSR 520 has a register length of n bit cells, where n is less than M, an internal shift frequency for the M scan chains is greater than M/n times a frequency at which a test vector is loaded into the seed register 510.

In an embodiment in which the total number of scan chains is partitioned into S groups 550-1-550-S, a response to a test is provided from each group of the S groups 550-1-550-S to signature register 530. In such a case, signature register 530 is an MISR as shown in FIG. 5. A compacted result can be provided by MISR 530 to a test controller as in FIG. 2. Alternately, a compacted result can be provided to seed register 510 that is configured to also receive a response in additional to providing a test seed vector to LFSR 520. MISR 510 can provide the compacted response via output 509 to an internal test controller internal to integrated circuit 502 or to an external test controller.

Figure 6:
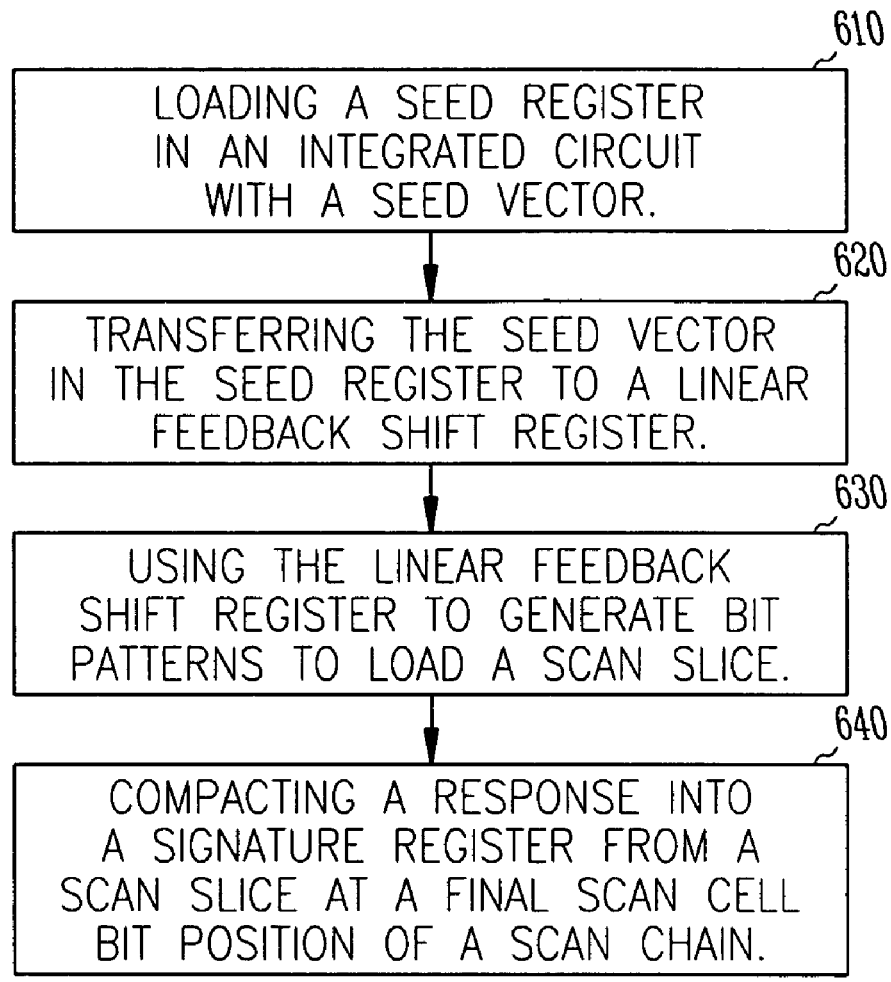
FIG. 6 shows a flowchart of an embodiment for vector testing using a linear feedback shift register, according to the present invention.

FIG. 6 shows a flowchart of an embodiment for vector testing using a linear feedback shift register, according to the present invention. The embodiment of a method, as shown in FIG. 6, includes loading a seed register in an integrated circuit with a seed vector, at block 610, transferring the seed vector in the seed register to a linear feedback shift register, at block 620, using the linear feedback shift register to generate bit patterns to load a scan slice, at block 630, and compacting a response into a signature register from a scan slice at a final scan cell bit position of a scan chain, at block 640. This embodiment of a method for testing can be realized with various embodiments for an architecture using reseeding of an LFSR as taught herein.

Using the feedback shift register to generate bits patterns and compacting a response into a signature register for a first seed vector can be performed in parallel with loading a second seed vector into seed register. For an embodiment in which a single scan channel is used for loading a seed register, a SISR can be used. In an embodiment in which multiple scan channels are used for loading a seed register where the total number of scan chains is configured as a single group, a SISR can be used. For an embodiment in which multiple scan channels are used for loading a seed register and the total number of scan chains is partitioned into groups, a MISR can be used.

In an embodiment, a seed vector is selectively provided to a linear feedback register to alter the current state of the LFSR in a controlled manner to produce a desired vector. Deterministic control of the vectors may be used for a set or number of clock cycles. The linear feedback shift register generates test vectors for a number of scan chains. The test vectors are loaded through the linear feedback shift register into scan cells of the scan chains at a shift frequency that is greater than a ratio of the number of scan chains to a register length of the linear feedback shift register times a frequency for loading a seed vector into the seed register. Test results input to a signature register from the scan chains may be regulated by masking one or more bits being input into the signature register.

An embodiment for an architecture of a compression scheme using LFSR 220, SISR 230, and seed register 210, all of the same register length n, for testing is shown in FIG. 2, where test controller 205 manages the test clocks and provides the control signals to rest of the DFT logic within the integrate circuit 202. Seed register 210 interfaces with test controller 205, loads the seed vector for LFSR 220 via a parallel load path, and runs off a tester clock. LFSR 220 acts as a pattern generator that recreates a deterministic pattern inside chip 202 using the initial seed loaded from test controller 205 to seed register 210, where LFSR 220 generates patterns needed to load one slice of the scan load. While LFSR 220 is shifting in the scan slice, the response from the chip is being compacted into SISR 230 from the scan slice at the bottom of scan chains 240-1 . . . 240-M, where the response can be examined at the end of the test to get a pass/fail result. SISR 230, LFSR 220, and the internal scan chains 240-1 . . . 240-M can run at a higher clock speed than the tester since more bits are being applied/sampled inside the chip 202. Additionally, loading the seed vector from test controller 205 can be overlapped with LFSR pattern generation and SISR response compaction to reduce apparent testing latency. If more vectors need to be applied, the above steps are repeated starting with loading the seed register at block 610. This embodiment provides a technique for using a linear feedback shift register to apply compressed vectors, which are basically seeds loaded into the seed register, at an internal scan shift rate that is higher than that possible using a tester clock, to achieve a significant reduction in test data volume and an enhances test time savings.

Figure 7:
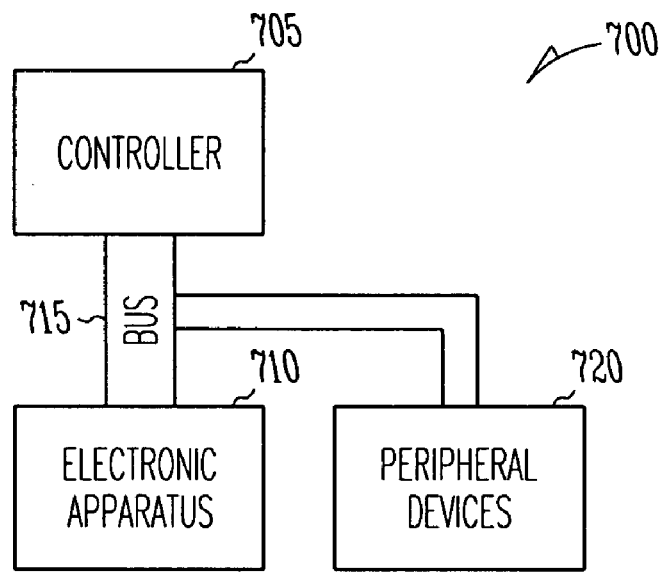
FIG. 7 illustrates a block diagram for a system having an embodiment for linear feedback shift register, according to the present invention.

FIG. 7 illustrates a block diagram for a system 700 having an embodiment for linear feedback shift register for testing according to the present invention. System 700 includes a controller 705, an electronic apparatus 710, and a bus 715, where bus 715 provides electrical conductivity between controller 705 and electronic apparatus 710. An embodiment may include an additional peripheral device or devices 720 coupled to bus 715. In various embodiments, controller 705 and/or electronic apparatus 710 include an embodiment for a linear feedback shift register and/or an architecture for a linear feedback shift register according to the teachings of the present invention. Electronic system 700 may include, but is not limited to, information handling devices, wireless systems, telecommunication systems, fiber optic systems, electro-optic systems, and computers. In an embodiment, controller 705 is a scan based processor and electronic apparatus 710 is a testing apparatus, which may include ATPG equipment or a debug system. In an embodiment, controller 705 is a scan based ASIC device and electronic apparatus 710 is a testing apparatus, which may include ATPG equipment or a debug system. In another embodiment, controller 705 is a scan based controller and electronic apparatus 710 is a memory device. The scan based controller may be a scan based processor or a scan based ASIC device. Peripheral devices 720 may include displays, additional storage memory, or other control devices that may operate in conjunction with controller 705. Alternately, peripheral devices 720 may include displays, additional storage memory, or other control devices that may operate in conjunction with controller 705 and/or electronic apparatus 710.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. An apparatus, comprising:
    a seed register within an integrated circuit to receive a seed vector;
    a linear feedback shift register within the integrated circuit to provide a bit pattern using the seed vector; and
    a signature register within the integrated circuit to provide a compressed response at a conclusion of a test of the integrated circuit, wherein the seed register, the linear feedback shift register, and the signature register each have a register length such that the register lengths of the seed register, the linear feedback shift register, and the single input signature register are equal.

2. The apparatus of claim 1, wherein the linear feedback shift register and the signature register each have a shift frequency such that the shift frequencies of the linear feedback shift register and the signature register are equal and greater than a frequency at which the seed vector is loaded into the seed register.

3. The apparatus of claim 1, wherein the signature register is a single input signature register.

4. The apparatus of claim 1, further including a test controller within the integrated circuit to provide the seed vector to the seed register, to provide bits to the linear feedback shift register, and to receive the compressed response from the signature register.

5. An apparatus, comprising:
    a seed register within an integrated circuit to receive a seed vector;
    a linear feedback shift register within the integrated circuit to provide a bit pattern using the seed vector;
    a signature register within the integrated circuit to provide a compressed response at a conclusion of a test of at least a portion of the integrated circuit, wherein the seed register, the linear feedback shift register, and the signature register each have a register length such that the register lengths of the seed register, the linear feedback shift register, and the single input signature register are equal; and
    a number of scan chains, each scan chain having an initial scan cell and a final scan cell, wherein the initial scan cell of each scan chain is populated through the linear feedback shift register and the test response is compacted into the signature register from the final scan cells of the number of scan chains.

6. The apparatus of claim 5, wherein the number of scan chains is M, where M is a positive integer, the linear feedback shift register has a register length of n bit cells, where n is a positive integer, n being less than M, such that an internal shift frequency for the M scan chains is greater than M/n times a frequency at which the test vector is loaded into the seed register.

7. The apparatus of claim 5, further including a number of exclusive-or logic units and a flush control input to selectively provide bits to the linear feedback shift register to control a degree to which a vector in the linear feedback shift register is dependent on previous vectors, wherein each exclusive-or logic unit is associated with one bit cell of the linear feedback shift register as an input to the associated bit cell.

8. The apparatus of claim 5, further including masking logic to provide one or more mask bits to regulate an input to the signature register.

9. The apparatus of claim 5, further including a shift control to select a horizontal mode shift or a vertical mode shift of the scan chains.

10. The apparatus of claim 5, further including a number of scan channels within an integrated circuit to receive test vectors.

11. The apparatus of claim 10, wherein the linear feedback shift register has a shift frequency to shift out a test vector at a rate M times faster than a rate at a seed vector is loaded into the seed register, M being the number of scan channels.

12. The apparatus of claim 10, wherein the number of scan chains is divided into a number of groups of scan chains, and the linear feedback shift register has a number of different internal taps to substantially load each group of scan chains simultaneously.

13. The apparatus of claim 12, further including a phase shifter to load bits into each group of the group of scan chains from the linear feedback shift register.

14. The apparatus of claim 12, wherein the signature register is a multiple input signature register having an input from each group of the group of scan chains.

15. A method of testing comprising:
    loading a seed register in an integrated circuit with a seed vector;

transferring the seed vector in the seed register to a linear feedback shift register;

generating bit patterns using the linear feedback shift register to load a slice of a scan load of a scan chain; and compacting a response into a signature register from a scan slice at a final scan cell bit position of a scan chain.

16. The method of claim 15, wherein the method further includes using the feedback shift register to generate bits patterns and compacting a response into a signature register for a first seed vector in parallel with loading a second seed vector into seed register.

17. The method of claim 15, wherein compacting a response into a signature register includes compacting a response into a single input signature register.

18. The method of claim 15, wherein compacting a response into a signature register includes compacting a response into a multiple input signature register.

19. The method of claim 15, wherein the method further includes shifting scan cells of a number of scan chains loaded through the linear feedback shift register at a shift frequency that is greater than a ratio of the number of scan chains to a register length of the linear feedback shift register times a frequency for loading a seed vector into the seed register.

20. The method of claim 15, wherein the method further includes masking one or more bits being input into the signature register.

21. The method of claim 15, wherein the method further includes selectively providing bits to the linear feedback shift register to control a degree to which a vector in the linear feedback shift register is dependent on previous vectors.

22. A system comprising:
a scan based integrated circuit; and
an electronic device coupled to the scan based integrated circuit, wherein the scan based integrated circuit includes:
  a seed register within an integrated circuit to receive a seed vector;
  a linear feedback shift register within the integrated circuit to provide a bit pattern using the seed vector;
  a signature register within the integrated circuit to provide a compressed response at a conclusion of a test of at least a portion of the integrated circuit, wherein the seed register, the linear feedback shift register, and the signature register each have a register length such that the register lengths of the seed register, the linear feedback shift register, and the single input signature register are equal; and
  a number of scan chains, each scan chain having an initial scan cell and a final scan cell, wherein the initial scan cell of each scan chain is populated through the linear feedback shift register and the test response is compacted into the signature register from the final scan cells of the number of scan chains.

23. The system of claim 22, wherein the linear feedback shift register and the signature register each have a shift frequency such that the shift frequencies of the linear feedback shift register and the signature register are equal and greater than a frequency at which the seed vector is loaded into the seed register.

24. The system of claim 22, wherein the signature register is a single input signature register.

25. The system of claim 22, further including a number of exclusive-or logic units and a flush control input to selectively provide bits to the linear feedback shift register to control a degree to which a vector in the linear feedback shift register is dependent on previous vectors, wherein each exclusive-or logic unit is associated with one bit cell of the linear feedback shift register as an input to the associated bit cell.

26. The system of claim 22, further including a shift control to select a horizontal mode shift or a vertical mode shift of the scan chains.

27. The system of claim 22 further including a number of scan channels within the integrated circuit to receive test vectors, wherein the number of scan chains is divided into a number of groups of scan chains, the linear feedback shift register has a number of different internal taps to substantially load each group of scan chains simultaneously, and the signature register is a multiple input signature register having an input from each group of the group of scan chains.

28. The system of claim 22, wherein the scan based integrated circuit is a processor and the electronic device is a memory device.

29. The system of claim 22, wherein the scan based integrated circuit is an ASIC integrated circuit.

30. The system of claim 22, wherein the electronic device is a tester external to the scan based integrated circuit.

* * * * *